United States Patent [19]

Crafts et al.

[11] Patent Number: 4,962,345

[45] Date of Patent: Oct. 9, 1990

[54] CURRENT LIMITING OUTPUT DRIVER

[75] Inventors: Harold S. Crafts; Maurice M. Moll, both of Fort Collins, Colo.

[73] Assignee: NCR Corporation, Dayton, Ohio

[21] Appl. No.: 432,260

[22] Filed: Nov. 6, 1989

[51] Int. Cl.⁵ .................. H03K 17/16; H03K 5/12
[52] U.S. Cl. ................... 307/270; 307/443; 307/451; 307/464; 307/263; 307/572; 307/579
[58] Field of Search ............. 307/443, 448, 451, 464, 307/572, 577, 579, 584–585, 263, 264, 270

[56] References Cited

U.S. PATENT DOCUMENTS

| | | | |
|---|---|---|---|
| 3,604,952 | 9/1971 | Regitz | 307/264 |
| 4,129,792 | 12/1978 | Kawagai et al. | 307/270 |
| 4,250,410 | 2/1981 | Moench et al. | 307/263 |
| 4,612,466 | 9/1986 | Stewart | 307/585 |
| 4,621,207 | 11/1986 | Suganuma et al. | 307/451 |
| 4,628,218 | 12/1986 | Nakaizumi | 307/451 |
| 4,731,553 | 3/1988 | Van Lehn et al. | 307/443 |
| 4,758,743 | 7/1988 | Dehganpour et al. | 307/270 |
| 4,777,389 | 10/1988 | Wu et al. | 307/443 |
| 4,779,013 | 10/1988 | Tanaka | 307/443 |
| 4,785,203 | 11/1988 | Nakamura | 307/451 |
| 4,789,796 | 12/1988 | Foss | 307/270 |
| 4,825,099 | 4/1989 | Barton | 307/270 |
| 4,829,199 | 5/1989 | Prater | 307/443 |
| 4,864,243 | 9/1989 | Reese | 328/110 |

OTHER PUBLICATIONS

Leung, "Controlled Slew Rate Output Buffer", *IEEE 1988 Custom Integrated Circuit Conference*, pp. 5.5.1–5.5.4.

Primary Examiner—Stanley D. Miller
Assistant Examiner—Margaret R. Wambach
Attorney, Agent, or Firm—Wilbert Hawk, Jr.; Douglas S. Foote

[57] ABSTRACT

An output driver for reducing current spikes in an output comprising three transistors connected between an output node and a reference voltage terminal. The first transistor is responsive to an input data signal, the second transistor is responsive to a first feedback signal from the output, and the third transistor is responsive to a second feedback signal from the output.

25 Claims, 2 Drawing Sheets

CURRENT LIMITING OUTPUT DRIVER

The present invention relates generally to integrated circuits. More particularly, it relates to an integrated circuit output driver which limits current for a range of output load conditions.

BACKGROUND OF THE INVENTION

Integrated circuits which perform logic functions provide digital logic signals at their output. In order to provide a transmission signal and to isolate the circuit logic elements from external interference, an output driver or buffer is typically employed. The output driver is connected between the logic circuit and transmission line and is usually fabricated on the same chip as the logic circuit. The driver responds to a data signal from the logic elements on the chip and provides a corresponding output signal on the transmission line. One type of output driver utilizes a single transistor connected between the transmission line and a reference voltage terminal. The transmission line is precharged to a high or low voltage corresponding to a high or low logic level. The output driver transmits a complementary signal by connecting the line to a reference potential terminal having a complementary value of the precharged line. A common driver configuration is an NMOS field effect transistor connected between the transmission line and ground with the transmission line precharged to a high value. This so-called "open drain driver" derives its name from the connection of the NMOS drain to the transmission line. When a low value is to be transmitted, the gate of the NMOS transistor receives a signal from the logic circuit creating a conduction path to ground and pulling the transmission line low.

Output drivers are known to have several problems associated with their operation. In some applications the transmission line has an effective external load with a significant capacitive component. When the driver transistor conducts, this capacitive effect can result in an excessive instantaneous current or spike through the transistor. In addition, in many circuits the switching speed of the driver transistor has evolved to the point where the time rate of change of the current has significantly increased. This can result in excessive noise in the power supply. Since the power supply is also connected to the chip, disturbances in the power supply voltage can upset the operation of the chip.

In gate array and other ASIC applications the loading of the transmission line is frequently unknown. Typically, a maximum source or sink current is specified. However, the capacitive effect is unknown and may vary over a relatively large range of values. Many output drivers operate well within a narrowly defined operating range but are not equipped to handle variable transmission line loading.

OBJECTS OF THE INVENTION

It is therefore an object of the present invention to provide a new and improved output driver.

It is another object of the present invention to provide an output driver which reduces current spikes in the output.

It is a further object of the present invention to provide an output driver which reduces the time rate of change of the current when the driver is switched on and off.

It is yet another object of the present invention to provide an output driver which operates independently of the output loading.

It is yet a further object of the present invention to provide an output driver for a gate array or ASIC which can be easily redesigned to account for gross operating conditions of a particular application.

It is still another object of the present invention to provide an output driver which can be constructed from conventional gate array or ASIC cells.

SUMMARY OF THE INVENTION

The present invention is an output driver comprising three transistors connected between an output node and a reference voltage terminal. The first transistor is responsive to an input data signal, the second transistor is responsive to a first feedback signal from the output, and the third transistor is responsive to a second feedback signal from the output.

DESCRIPTION OF A PREFERRED EMBODIMENT

Figure 1:
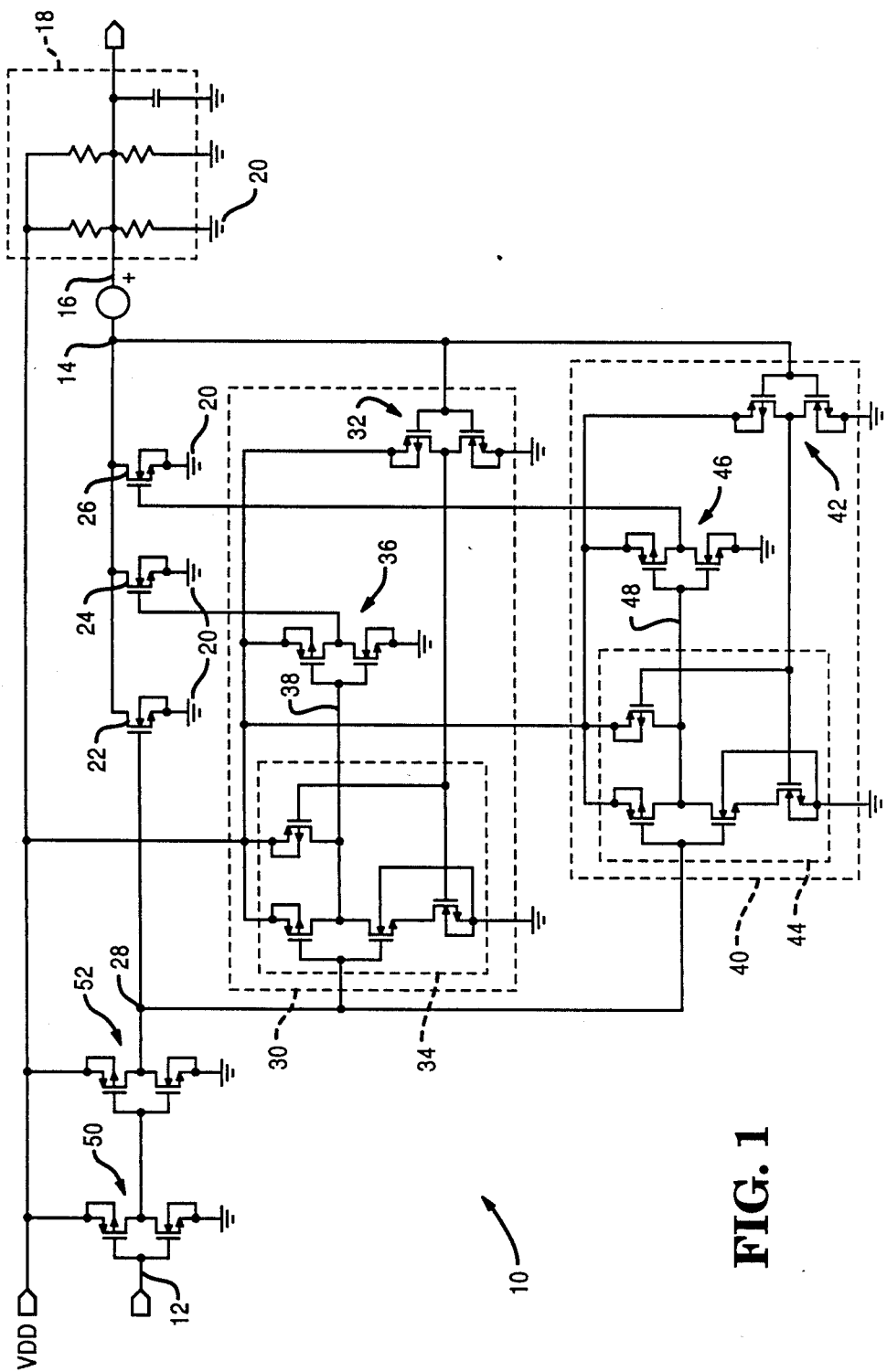
FIG. 1 is a circuit diagram of an output driver according to one form of the present invention.

FIG. 1 shows an output driver 10 which receives a high or low input signal on data supply line 12 and provides an output signal at an output node 14. Output node 14 is connected to a transmission line 16 which includes a resistive and capacitive load 18. Transmission line 16 is connected by resistors between high voltage terminal VDD and low voltage terminal 20. In a preferred embodiment VDD is about 5 volts and terminal 20 is about 0 volts or ground. Other values for VDD and terminal 20 are possible including reversing the polarities of the high and low terminals.

Output driver 10 includes transistors 22, 24 and 26 connected between output node 14 and reference voltage terminal 20 (ground). In a preferred embodiment, transistors 22, 24 and 26 are NMOS field effect transistors having their drains connected to output node 14 and their sources connected to ground. The control electrode or gate of transistor 22 is connected to an input node 28 for receiving an input data signal. Transistor 22 is responsive to the input data signal, conducting when the signal is high and turning off when the signal is low. Transistor 24 is responsive to a feedback signal received by its gate from output node 14, and transistor 26 is responsive to another feedback signal received by its gate from output node 14, as will be described more fully.

The feedback signal received by the gate of transistor 24 is provided by a circuit 30 connected between output node 14 and the gate of transistor 24. Circuit 30 includes an inverter 32, a NAND gate 34 and an inverter 36 series connected between output node 14 and the gate of transistor 24. Other coincidence gates other than NAND gate 34 may alternatively be employed depending upon the output signal required. Inverter 32 is connected between VDD and ground, its input is connected to output node 14, and its output is connected one input of NAND gate 34. The other input of NAND gate 34 is connected to input node 28. The output of NAND gate 34 is connected to input line 38 of inverter 36, and the output of inverter 36 is connected to the gate of transistor 24. Of particular interest in circuit 30 is the threshold voltage of inverter 32. As is well known, the threshold voltage of an inverter is that voltage at which the inverter switches between the high or low voltages supplied to its output. The threshold can be varied by adjusting the relative sizes of the PMOS and NMOS transistors which comprise the inverter. For example, in the embodiment shown, if the voltage on output node 14 is high the output of inverter 32 is low. There will normally be a range of high values for node 14, all of which should result in the same low value at the output of inverter 32. In other words, the threshold voltage of inverter 32 is less than the lowest design value for a high output on node 14. The output of inverter 32 will only switch after a data signal is received by transistor 22 and the output voltage on node 14 starts to drop.

The feedback signal received by the gate of transistor 26 is provided by a circuit 40 connected between output node 14 and the gate of transistor 26. Circuit 40 includes an inverter 42, a NAND gate 44 and an inverter 46 series connected between output node 14 and the gate of transistor 26. Other coincidence gates other than NAND gate 44 may alternatively be employed depending upon the output signal required. Inverter 42 is connected between VDD and ground, its input is connected to output node 14, and its output is connected one input of NAND gate 44. The other input of NAND gate 44 is connected to input node 28. The output of NAND gate 44 is connected to input line 48 of inverter 46, and the output of inverter 46 is connected to the gate of transistor 26. Of particular interest in circuit 40 is the threshold voltage of inverter 42. The threshold voltage of inverter 42 can be set in a manner similar to that described above for inverter 32. However, the threshold voltage of inverter 42 will be less than that of inverter 32, as will be described more fully.

Driver 10 also includes a pair of inverters 50 and 52 connected between data supply line 12 and transistor 22. Inverters 50 and 52 provide the input data signal to transistor 22 and to one input each of NAND gates 34 and 44. The number of such inverters can vary depending upon design requirements.

In operation, transmission line 16 is precharged to approximately the voltage of terminal VDD by external pull-up resistors. When a high data signal is received on input node 28, transistor 22 responds by conducting current between output node 14 and ground, thereby dropping the output voltage on node 14. Each of transistors 22, 24 and 26 exhibits a characteristic resistance which for a MOS transistor is inversely proportional to its channel width. The channel width of transistor 22 is relatively small to prevent a surge of current in output node 14 and reduce the time rate of change of the current (di/dt). However, as the voltage starts to drop on output node 14, transistor 22 is too small to conduct enough current to drop the output voltage to its required low value. In order to allow sufficient current flow, transistors 24 and 26 are sequentially activated, as will be described.

When transistor 22 has pulled the voltage on output node 14 below the threshold voltage of inverter 32, the output of inverter 32 goes high. NAND gate 34 is thereby provided with high values on both of its inputs which switches its output (input line 38 of inverter 36) low. In response, the output of inverter 36 goes high which completes the feedback loop by its connection to the gate of transistor 24. Transistor 24 responds to this feedback signal by conducting current between output node 14 and ground, in parallel with transistor 22, which tends to increase the current flow in the output. However, since the output voltage has dropped, the current due to transistors 22 and 24 operating together is about the same as the current when transistor 22 was operating alone, and there is no increase in di/dt.

When transistors 22 and 24 have pulled the voltage on output node 14 below the threshold voltage of inverter 42, which is less than the threshold voltage of inverter 32, the output of inverter 42 goes high. NAND gate 44 is thereby provided with high values on both of its inputs which switches its output (input line 48 of inverter 46) low. In response, the output of inverter 46 goes high which completes the second feedback loop by its connection to the gate of transistor 26. Transistor 26 responds to this feedback signal by conducting current between output node 14 and ground, in parallel with transistors 22 and 24, which tends to increase the current flow in the output. However, since the output voltage has again dropped, the current due to transistors 22, 24 and 26 operating together is about the same as the current when transistors 22 and 24 were operating alone.

Transistors 22, 24 and 26 are sized so that their combined parallel resistance is able to maintain transmission line 16 at a low voltage for a worst case design load. However, it will be appreciated that the dual feedback design with differential threshold voltages on inverters 32 and 42 inherently compensates for different loads on the transmission line. For example, as the line capacitance increases, transistor 22 will take longer to reduce the output voltage below the threshold of inverter 32. Thus, although inverter 32 delays the feedback signal to transistor 24 until after transistor 22 conducts and inverter 42 delays the feedback signal to transistor 26 until after transistor 24 conducts, circuits 30 and 40 are not simply delay lines. The differential threshold voltage of inverters 32 and 42 together with the relative sizing of transistors 22, 24 and 26 ensure that driver 10 will automatically compensate for different loading conditions to prevent current spikes in output node 14.

In one embodiment, the characteristic resistance (R1) of transistor 22 is greater than the characteristic resistance (R2) of transistor 24 and the characteristic resistance of transistor 24 is greater than the characteristic resistance (R3) of transistor 26. In a preferred embodiment, R1 is about two times R2 and between about three to four times R3. Thus, for a MOS transistor, the channel width of transistor 24 is about two times that of transistor 22, and the channel width of transistor 26 is about three to four times that of transistor 22.

Figure 2:
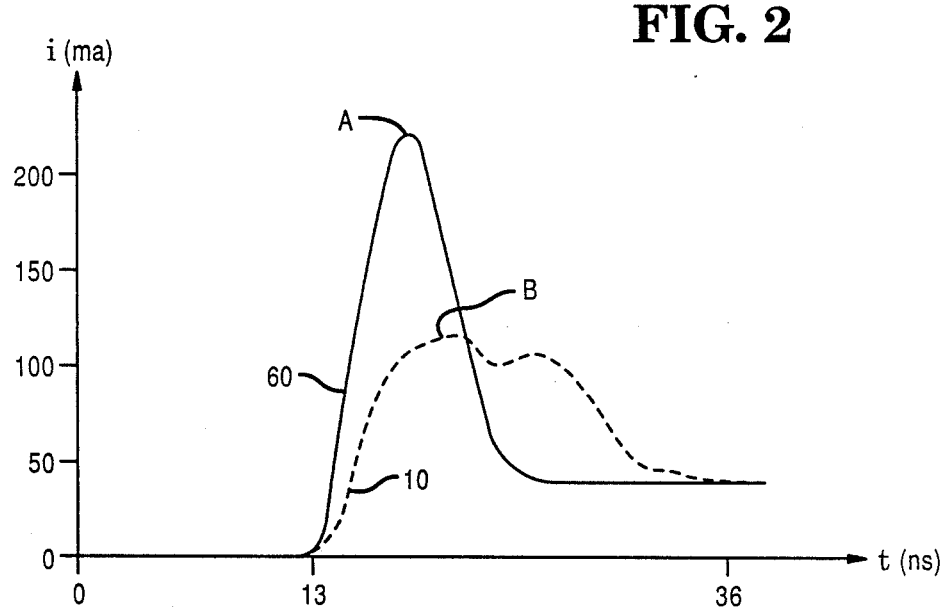
FIG. 2 is a graph of output current vs. time comparing a prior art driver and the driver of the present invention.

FIG. 2 shows a comparison in output current between an output driver 60 having a single transistor, and a driver 10 having three transistors according to the present invention. As shown, driver 60 can experience a current spike A in the output as well as a relatively high time rate of change of the current as reflected by its slope. In contrast, driver 10 has a much reduced spike B, and a reduced time rate of change of current.

It will be clear to those skilled in the art that the present invention is not limited to the specific embodiment disclosed and illustrated herein. Numerous modifications, variations, and full and partial equivalents can be undertaken without departing from the invention as limited only by the spirit and scope of the appended claims.

What is desired to be secured by Letters Patent of the United States is as follows.

What is claimed is:

1. An output driver comprising:
   a first transistor connected between an output node and a reference voltage terminal and responsive to an input data signal;
   a second transistor connected between said output node and said reference voltage terminal and responsive to a first feedback signal from said output; and
   a third transistor connected between said output node and said reference voltage terminal and responsive to a second feedback signal from said output.

2. The driver of claim 1 further comprising:
   a first circuit, connected between said output node and a control electrode of said second transistor, for providing said first feedback signal; and
   a second circuit, connected between said output node and a control electrode of said third transistor, for providing said second feedback signal.

3. The driver of claim 2 wherein:
   said first circuit includes a first inverter, a first coincidence gate and second inverter series connected between said output node and the control electrode of said second transistor; and
   said second circuit includes a third inverter, a second coincidence gate and fourth inverter series connected between said output node and the control electrode of said third transistor.

4. The driver of claim 3 wherein:
   said inverters each have an input and an output, said first coincidence gate has a first input connected to the output of said first inverter, a second input connected to an input node for receiving said input data signal, and an output connected to the input of said second inverter; and
   said second coincidence gate has a first input connected to the output of said third inverter, a second input connected to said input node, and an output connected to the input of said fourth inverter.

5. The driver of claim 3 wherein said first and second coincidence gates are two-input NAND gates.

6. The driver of claim 2 wherein said first circuit includes first delaying means for delaying said first feedback signal until after said data signal is provided to said first transistor, and said second circuit includes second delaying means for delaying said second feedback signal until after said first feedback signal is provided to said second transistor.

7. The driver of claim 6 wherein:
   said first delaying means includes a first inverter connected between high and low voltage terminals, having an input connected to said output node, and having a first threshold voltage for switching between said high and low voltage terminals; and
   said second delaying means includes a second inverter connected between said high and low voltage terminals, having an input connected to said output node, and having a second threshold voltage, different than said first threshold voltage, for switching between said high and low voltage terminals.

8. The driver of claim 7 wherein the threshold voltage of said second inverter is less than the threshold voltage of said first inverter.

9. The driver of claim 1 wherein said first, second and third transistors are NMOS field effect transistors.

10. The driver of claim 9 wherein said reference voltage terminal is ground.

11. The driver of claim 1 further comprising:
    a pair of inverters series connected between a data supply line and a control electrode of said first transistor for providing said input data signal to said first transistor.

12. The driver of claim 1 wherein:
    said first transistor responds to said input data signal by conducting current between said output node and reference voltage terminal with a characteristic first resistance;
    said second transistor responds to said first feedback signal by conducting current between said output node and reference voltage terminal with a characteristic second resistance;
    said third transistor responds to said second feedback signal by conducting current between said output node and reference voltage terminal with a characteristic third resistance; and
    said first resistance is greater than said second resistance and said second resistance is greater than said third resistance.

13. The driver of claim 12 wherein said first, second and third transistors are MOS field effect transistors.

14. The driver of claim 13 wherein the channel width of said first transistor is less than the channel width of said second transistor and the channel width of said second transistor is less than the channel width of said third transistor.

15. The driver of claim 14 wherein the channel width of said second transistor is generally twice the channel width of said first transistor and the channel width of said third transistor is generally three to four times the channel width of said first transistor.

16. The driver of claim 2 further comprising means for reducing current spikes in said output node in response to said input data signal.

17. The driver of claim 16 wherein:
    said first circuit includes a first inverter connected to said output node, and said second circuit includes a second inverter connected to said output node; and
    said means includes said first, second and third transistors characterized by the characteristic resistance of said transistors, and includes said first and second inverters characterized by the threshold voltages of said inverters.

18. The driver of claim 17 wherein:
    the characteristic resistance of said first transistor is greater than the characteristic resistance of said second transistor and the characteristic resistance of said second transistor is greater than the characteristic resistance of said third transistor; and
    the threshold voltage of said second inverter is less than the threshold voltage of said first inverter.

19. An output driver for reducing current spikes in said output comprising:
    a first transistor connected between an output node and a reference voltage terminal and responsive to an input data signal for conducting current therebetween with a characteristic first resistance;
    a second transistor connected between said output node and said reference voltage terminal and responsive to a first feedback signal from said output for conducting current between said output node and reference voltage terminal with a characteristic second resistance;

a third transistor connected between said output node and said reference voltage terminal and responsive to a second feedback signal from said output for conducting current between said output node and reference voltage terminal with a characteristic third resistance, wherein said first resistance is greater than said second resistance and said second resistance is greater than said third resistance;

a first circuit, connected between said output node and a control electrode of said second transistor, for providing said first feedback signal, wherein said first circuit includes first delaying means for delaying said first feedback signal until after said data signal is provided to said first transistor; and a second circuit, connected between said output node and a control electrode of said third transistor, for providing said second feedback signal, wherein said second circuit includes second delaying means for delaying said second feedback signal until after said first feedback signal is provided to said second transistor.

20. The driver of claim 19 wherein:

said first circuit includes a first inverter, a first coincidence gate and second inverter series connected between said output node and the control electrode of said second transistor; and said second circuit includes a third inverter, a second coincidence gate and fourth inverter series connected between said output node and a control electrode of said third transistor.

21. The driver of claim 20 wherein:

said first, second and third transistors are MOS field effect transistors; and the channel width of said first transistor is less than the channel width of said second transistor and the channel width of said second transistor is less than the channel width of said third transistor.

22. The driver of claim 21 wherein:

said first delaying means includes said first inverter connected between high and low voltage terminals, having an input connected to said output node, and having a first threshold voltage for switching between said high and low voltage terminals;

said second delaying means includes said third inverter connected between said high and low voltage terminals, having an input connected to said output node, and having a second threshold voltage for switching between said high and low voltage terminals; and the threshold voltage of said second inverter is less than the threshold voltage of said first inverter.

23. The driver of claim 22 wherein:

said inverters each have an input and an output, said first coincidence gate is a two-input NAND gate having a first input connected to the output of said first inverter, a second input connected to an input node for receiving said input data signal, and an output connected to the input of said second inverter; and said second coincidence gate is a two-input NAND gate having a first input connected to the output of said third inverter, a second input connected to said input node, and an output connected to the input of said fourth inverter.

24. The driver of claim 23 wherein said first, second and third transistors are NMOS field effect transistors, and wherein said reference voltage and low voltage terminals are ground.

25. The driver of claim 24 further comprising:

a pair of inverters series connected between a data supply line and said first transistor for providing said input data signal to said first transistor.

* * * * *